(12) United States Patent
Lee et al.

(10) Patent No.: US 11,869,718 B2
(45) Date of Patent: Jan. 9, 2024

(54) MULTILAYER CAPACITOR AND BOARD HAVING THE SAME MOUNTED THEREON

(71) Applicant: SAMSUNG ELECTRO-MECHANICS CO., LTD., Suwon-si (KR)

(72) Inventors: Gi Sub Lee, Suwon-si (KR); Ah Young Lee, Suwon-si (KR); Chung Hyeon Ryu, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 274 days.

(21) Appl. No.: 17/552,786

(22) Filed: Dec. 16, 2021

(65) Prior Publication Data

US 2022/0189690 A1 Jun. 16, 2022

Related U.S. Application Data

(63) Continuation-in-part of application No. 17/478,264, filed on Sep. 17, 2021, now abandoned.

(30) Foreign Application Priority Data

Dec. 15, 2020 (KR) .................. 10-2020-0175198
Dec. 3, 2021 (KR) .................. 10-2021-0171498

(51) Int. Cl.
*H01G 4/248* (2006.01)
*H01G 4/01* (2006.01)
(Continued)

(52) U.S. Cl.
CPC .............. *H01G 4/01* (2013.01); *H01G 4/248* (2013.01); *H01G 4/30* (2013.01); *H05K 1/111* (2013.01);
(Continued)

(58) Field of Classification Search
CPC ...................................... H01G 4/248
(Continued)

(56) References Cited

U.S. PATENT DOCUMENTS

2013/0250473 A1* 9/2013 Bultitude ............. H01G 4/30
  29/25.42
2015/0170842 A1* 6/2015 An ...................... H01G 4/012
  361/321.2
(Continued)

FOREIGN PATENT DOCUMENTS

JP 2000-012377 A 1/2000
JP 2000-040634 A 2/2000
KR 10-2017-0011247 A 2/2017

*Primary Examiner* — Stanley Tso
(74) *Attorney, Agent, or Firm* — Morgan Lewis & Bockius LLP

(57) ABSTRACT

A multilayer capacitor includes a capacitor body having first to sixth surfaces, including a plurality of first and second dielectric layers and a plurality of internal electrodes stacked; and first and second external electrodes. The internal electrode includes first and second internal electrodes, a first floating electrode disposed between the first and second internal electrodes on the first dielectric layer, and second and third floating electrodes disposed on the second dielectric layer. The second floating electrode overlaps a portion of the first internal electrode and a portion of the first floating electrode, and the third floating electrode overlaps a portion of the second internal electrode and a portion of the first floating electrode. a/L is 0.113 or more, in which L is a length of the capacitor body, and a is a distance between the first floating electrode and the first or second internal electrodes.

24 Claims, 11 Drawing Sheets

(51) Int. Cl.
*H01G 4/30* (2006.01)
*H05K 1/18* (2006.01)
*H05K 1/11* (2006.01)

(52) U.S. Cl.
CPC ... *H05K 1/181* (2013.01); *H05K 2201/10015* (2013.01)

(58) Field of Classification Search
USPC .......................................................... 174/260
See application file for complete search history.

(56) References Cited

U.S. PATENT DOCUMENTS

| | | | |
|---|---|---|---|
| 2015/0179339 A1* | 6/2015 | Seo ......................... | H01G 4/30 |
| | | | 361/301.4 |
| 2016/0099107 A1* | 4/2016 | Lee ......................... | H01G 4/30 |
| | | | 361/301.4 |
| 2016/0111216 A1* | 4/2016 | Lee ........................ | H01G 4/232 |
| | | | 361/301.4 |
| 2016/0240311 A1* | 8/2016 | Lee ........................ | H01G 4/232 |
| 2018/0012706 A1* | 1/2018 | Bultitude ................ | H01G 4/33 |

* cited by examiner

MULTILAYER CAPACITOR AND BOARD HAVING THE SAME MOUNTED THEREON

CROSS-REFERENCE TO RELATED APPLICATION(S)

This application is a Continuation-In-Part of U.S. patent application Ser. No. 17/478,264, filed on Sep. 17, 2021, which claims benefit under 35 USC 119(a) of Korean Patent Application Nos. 10-2020-0175198 filed on Dec. 15, 2020 and 10-2021-0171498, filed on Dec. 3, 2021, in the Korean Intellectual Property Office, the entire disclosures of which are incorporated herein by reference for all purposes.

TECHNICAL FIELD

The present disclosure relates to a multilayer capacitor and a board having the same mounted thereon.

BACKGROUND

In recent years, as eco-friendly vehicles and electric vehicles have rapidly risen in popularity, the importance of power driving systems inside automobiles has increased, and accordingly, demand for multilayer capacitors required for power driving systems for electric devices has also increased.

In the case of such a multilayer capacitor for electric fields, high capacity may be implemented, excellent durability against vibrations and deformation is required, and it is designed to be usable at a high voltage.

As a method for increasing a withstand voltage of a multilayer capacitor, there is a method of dividing the voltage using a floating electrode.

However, in this case, there may be a problem in which reliability of a multilayer capacitor is deteriorated.

SUMMARY

This summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

Exemplary embodiments provide a multilayer capacitor in which a certain level of reliability may be secured while increasing withstand voltage characteristics by using a floating electrode, and a board having the multilayer capacitor mounted thereon.

According to an exemplary embodiment, a multilayer capacitor includes a capacitor body having first and second surfaces opposing each other, third and fourth surfaces connected to the first and second surfaces and opposing each other, and fifth and sixth surfaces connected to the first and second surfaces, connected to the third and fourth surfaces, and opposing each other, the capacitor body including a plurality of first and second dielectric layers and a plurality of internal electrodes stacked; and first and second external electrodes disposed on the third and fourth surfaces of the capacitor body, respectively. The internal electrode includes first and second internal electrodes disposed on the first dielectric layer to be spaced apart from each other in the first direction, and connected to the first and second external electrodes, respectively; a first floating electrode disposed between the first and second internal electrodes on the first dielectric layer; and second and third floating electrodes disposed on the second dielectric layer to be spaced apart from each other in the first direction. The second floating electrode overlaps a portion of the first internal electrode and a portion of the first floating electrode, and the third floating electrode overlaps a portion of the second internal electrode and a portion of the first floating electrode. a/L is greater than or equal to 0.113, in which L is a length of the capacitor body in the first direction, and a is a distance between the first floating electrode and the first internal electrode or a distance between the first floating electrode and the second internal electrode.

b/L may be greater than or equal to 0.09, in which b is a distance between the second floating electrode and the third surface of the capacitor body or a distance between the third floating electrode and the fourth surface of the capacitor body.

c/W may be greater than or equal to 0.138, in which W is a length of the capacitor body in the second direction, and c is a distance, in the second direction, between one of the first and second internal electrodes and the first floating electrode and the fifth or sixth surface of the capacitor body.

The first and second external electrodes may include, respectively, first and second connection portions disposed on the third and fourth surfaces of the capacitor body respectively, and connected to the first and second internal electrodes respectively; and first and second band portions extending from the first and second connection portions to a portion of the first surface of the capacitor body, respectively.

The first to third floating electrodes may be spaced apart from the third to sixth surfaces, the first external electrode may be connected to the first internal electrode, and the second external electrode may be connected to the second internal electrode.

In a stacking direction of the plurality of first and second dielectric layers, the second floating electrode may partially overlap the first internal electrode and the first floating electrode and the third floating electrode may partially overlap the second internal electrode and the first floating electrode.

According to an exemplary embodiment, a board having a multilayer capacitor mounted thereon, includes a substrate having first and second electrode pads on one surface, and the multilayer capacitor described above, the multilayer capacitor being mounted in such a manner that first and second external electrodes of the multilayer capacitor are connected to the first and second electrode pads, respectively.

According to an exemplary embodiment, a multilayer capacitor includes a capacitor body having first and second surfaces opposing each other, third and fourth surfaces connected to the first and second surfaces and opposing each other in a first direction, and fifth and sixth surfaces connected to the first and second surfaces, connected to the third and fourth surfaces, and opposing each other in a second direction, the capacitor body including a plurality of first and second dielectric layers and a plurality of internal electrodes stacked; and first and second external electrodes disposed on the third and fourth surfaces of the capacitor body, respectively. The plurality of internal electrode include first and second internal electrodes disposed on the first dielectric layer to be spaced apart from each other in the first direction, and connected to the first and second external electrodes, respectively; a first floating electrode disposed between the first and second internal electrodes on the first dielectric layer; and second and third floating electrodes disposed on the second dielectric layer to be spaced apart from each other in the first direction. The second floating electrode overlaps a portion of the first internal electrode and a portion of the first floating electrode, and the third floating electrode overlaps a portion of the second internal electrode and a portion of the first floating electrode. b/L is greater than or equal to 0.09, in which L is a length of the capacitor body in the first direction, and b is a distance between the second floating electrode and the third surface of the capacitor body or a distance between the third floating electrode and the fourth surface of the capacitor body.

According to an exemplary embodiment, a multilayer capacitor includes a capacitor body having first and second surfaces opposing each other, third and fourth surfaces connected to the first and second surfaces and opposing each other in a first direction, and fifth and sixth surfaces connected to the first and second surfaces, connected to the third and fourth surfaces, and opposing each other in a second direction, the capacitor body including a plurality of first and second dielectric layers and a plurality of internal electrodes stacked; and first and second external electrodes disposed on the third and fourth surfaces of the capacitor body, respectively. The plurality of internal electrode include first and second internal electrodes disposed on the first dielectric layer to be spaced apart from each other in the first direction, and connected to the first and second external electrodes, respectively; a first floating electrode disposed between the first and second internal electrodes on the first dielectric layer; and second and third floating electrodes disposed on the second dielectric layer to be spaced apart from each other in the first direction. The second floating electrode overlaps a portion of the first internal electrode and a portion of the first floating electrode, and the third floating electrode overlaps a portion of the second internal electrode and a portion of the first floating electrode. c/W is greater than or equal to 0.138, in which W is a length of the capacitor body in the second direction, and c is a distance, in the second direction, between one of the first and second internal electrodes and the first floating electrode and the fifth or sixth surface of the capacitor body.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
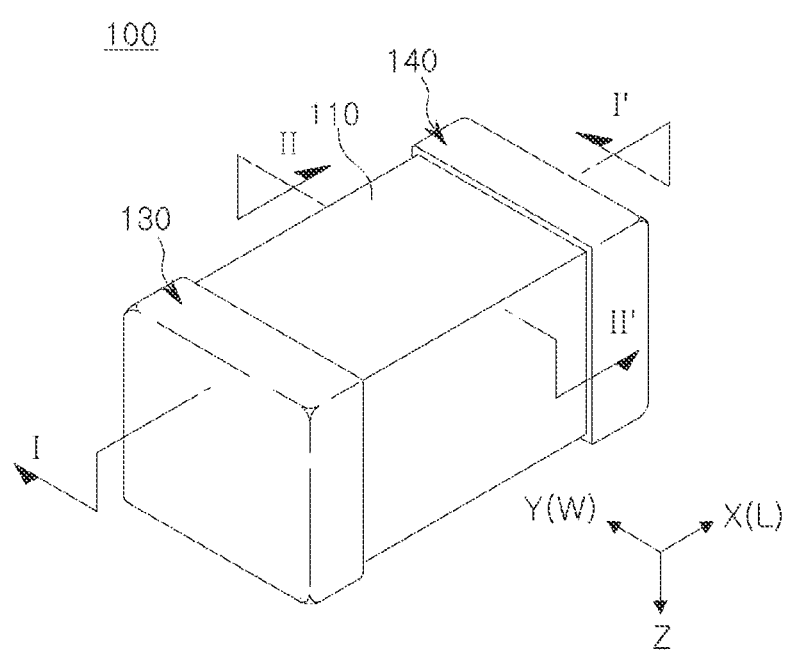
FIG. 1 is a schematic perspective view of a multilayer capacitor according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed, as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an embodiment or example, e.g., as to what an embodiment or example may include or implement, means that at least one embodiment or example exists in which such a feature is included or implemented while all embodiments or examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

The drawings may not be to scale, and the relative sizes, proportions, and depiction of elements in the drawings may be exaggerated for clarity, illustration, and convenience.

In addition, components having the same function within the scope of the same spirit illustrated in the drawings of embodiments will be described with the same reference numerals.

When defining the direction in the present disclosure, in FIG. 1, X is a length direction, Y is a width direction, and Z is a thickness direction. In addition, in the following description, the X direction may also be described as a first direction and the Y direction may also be described as a second direction.

Figure 2A:
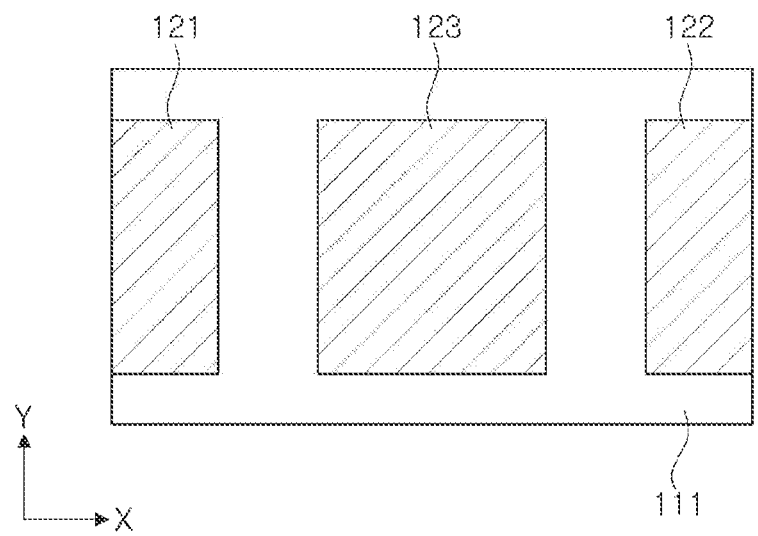
FIGS. 2A and 2B are plan views illustrating an arrangement structure of first and second internal electrodes and first to third floating electrodes applied to FIG. 1.
Figure 2B:
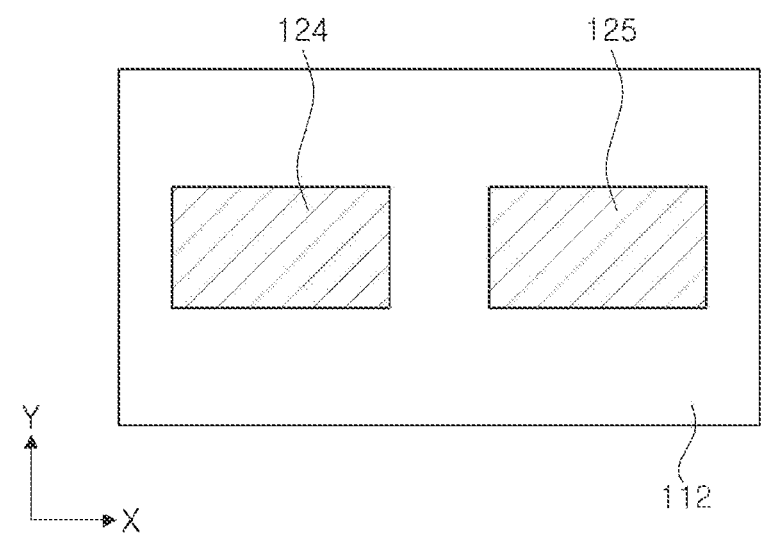
Figure 3:
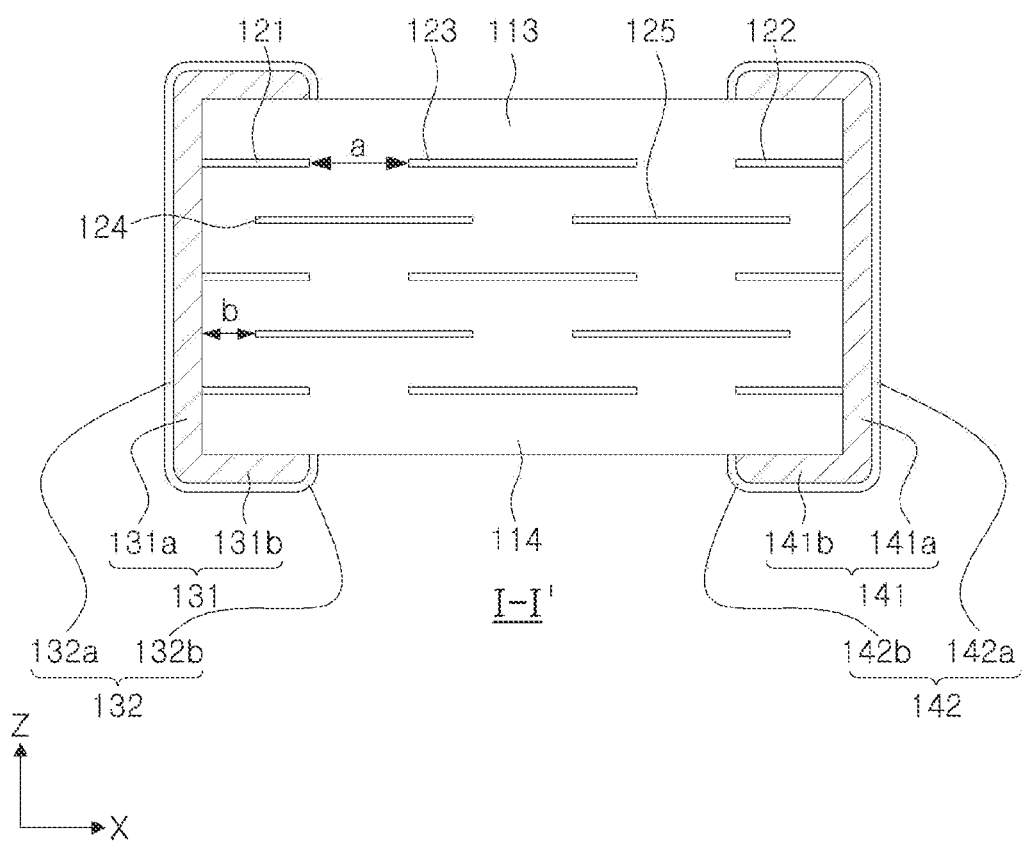
FIG. 3 is a cross-sectional view taken along line I-I' of FIG. 1.
Figure 4:
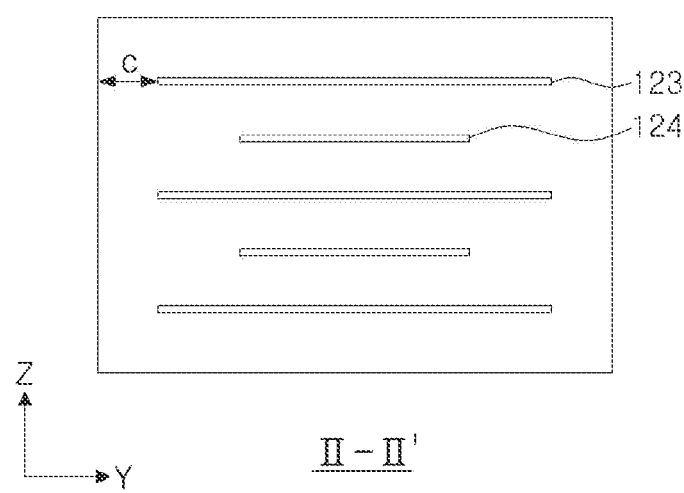
FIG. 4 is a cross-sectional view taken along line II-II' of FIG. 1.

FIG. 1 is a schematic perspective view of a multilayer capacitor according to an embodiment, and FIGS. 2A and 2B are plan views illustrating an arrangement structure of first and second internal electrodes and first to third floating electrodes, applied to FIG. 1, FIG. 3 is a cross-sectional view taken along line I-I' of FIG. 1, and FIG. 4 is a cross-sectional view taken along line II-II' of FIG. 1.

Referring to FIGS. 1 to 4, a multilayer capacitor 100 according to an embodiment includes a capacitor body 110 including a plurality of dielectric layers 111 and a plurality of internal electrodes, and first and second external electrodes 130 and 140.

In this case, the internal electrodes include first and second internal electrodes 121 and 122, and first to third floating electrodes 123, 124 and 125.

The capacitor body 110 is formed by alternately stacking a plurality of first and second dielectric layers 111 and 112 in the Z direction to then be sintered, and adjacent first and second dielectric layers 111 and 112 may be integrated such that boundaries therebetween may not be confirmed without a scanning electron microscope (SEM). In this case, the capacitor body 110 may have a substantially hexahedral shape. The capacitor body 110 may include first and second surfaces 1 and 2 opposed in a third direction (a Z direction), third and fourth surfaces 3 and 4 connected to the first and second surfaces 1 and 2 and opposed in a first direction (an X direction), and fifth and sixth surfaces 5 and 6 connected to the first to fourth surfaces 1 to 4 and opposed in a second direction (a Y direction).

The first and second dielectric layers 111 and 112 may include a ceramic material having a high dielectric constant, for example, barium titanate ($BaTiO_3$)-based ceramic powder, or the like, but as long as sufficient capacitance may be obtained therewith, the material thereof is not limited thereto.

In addition, various kinds of ceramic additives, organic solvents, plasticizers, binders and dispersants may be further added to the first and second dielectric layers 111 and 112 together with the ceramic powder.

In this case, the ceramic additive may be at least one of a transition metal oxide, a transition carbide, a rare earth element, magnesium (Mg), or aluminum (Al).

Referring to FIGS. 3 and 4, in the cross-section of the multilayer capacitor 100, portions in which the internal electrode is not formed may be defined as margin portions.

In this case, among the margin portions, margin portions located in upper and lower portions of the capacitor body 110 in the Z direction may be defined as upper and lower covers 113 and 114.

The upper and lower covers 113 and 114 may be formed by sintering a plurality of ceramic sheets, similar to the first or second dielectric layers 111 or 112, and may have a structure similar to the first or second dielectric layer 111 or 112 located in the center of the capacitor body 110 except that the internal electrode is not formed.

In this embodiment, the first and second internal electrodes 121 and 122 and the first floating electrode 123 are disposed on one first dielectric layer 111, and the second and third floating electrodes 124 and 125 are disposed on one second dielectric layer 112.

The first and second internal electrodes 121 and 122 and the first to third floating electrodes 123 to 125 are formed of a conductive metal, and as the conductive metal, at least one of, for example, silver (Ag), lead (Pb), platinum (Pt), nickel (Ni), copper (Cu), and alloys thereof, may be used, and the present disclosure is not limited thereto.

The first and second internal electrodes 121 and 122 are electrodes to which voltages having different polarities are applied, and are formed to be spaced apart from each other in the X direction, on at least one surface of one ceramic sheet forming one first dielectric layer 111, and are disposed in the capacity body 110 to be led out through third and fourth surfaces 3 and 4 which are both surfaces of the capacitor body 110 in the length direction, respectively.

The first floating electrode 123 is disposed on the first dielectric layer 111 to be spaced apart from the first and second internal electrodes 121 and 122 in the X direction, and is also disposed to be spaced apart from third to sixth surfaces 3 to 6 of the capacitor body 110.

The second and third floating electrodes 124 and 125 are disposed on the second dielectric layer 112, are alternately disposed with the first and second internal electrodes 121 and 122 and the first floating electrode 123 in the capacitor body 110 in the Z direction, and are disposed on a single second dielectric layer 112 to be spaced apart from each other in the X direction.

In addition, the second and third floating electrodes 124 and 125 are also disposed to be spaced apart from the third to sixth surface 3 to 6 of the capacitor body.

In this case, one end of the second floating electrode 124 overlaps a portion of the first internal electrode 121 in the Z direction, and the other end of the second floating electrode 124 overlaps a portion of the first floating electrode 123 in the Z direction.

One end of the third floating electrode 125 overlaps a portion of the second internal electrode 122 in the Z direction, and the other end thereof overlaps a portion of the first floating electrode 123 in the Z direction.

On the other hand, the lengths of the first and second internal electrodes 121 and 122 and the first floating electrode 123 in the Y direction may be greater than the lengths of the second and third floating electrodes 124 and 125 in the Y direction.

When a voltage is applied to the first and second external electrodes according to the structure of the internal electrodes, the multilayer capacitor may form capacitance.

In addition, the multilayer capacitor 100 of this embodiment may include the first and second external electrodes 130 and 140, which are formed on the third and fourth surfaces 3 and 4 of the capacitor body 110 in the X direction, respectively and contact and are electrically connected to the first and second internal electrodes 121 and 122 exposed through the third and fourth surfaces 3 and 4 of the capacitor body 110 in the X direction, respectively.

The first and second external electrodes 130 and 140 include first and second conductive layers 131 and 141 formed of a conductive metal, and the first and second conductive layers 131 and 141 may be formed of, for example, one of silver (Ag), lead (Pb), platinum (Pt), nickel (Ni), copper (Cu), and alloys thereof, and the present disclosure is not limited thereto.

The first and second conductive layers 131 and 141 may include first and second connection portions 131a and 141a formed on the third and fourth surfaces 3 and 4 of the capacitor body 110, respectively, and connected to the first and second internal electrodes 121 and 122, respectively, and first and second band portions 131b and 141b extending from the first and second connection portions 131a and 141a to a portion of the first surface 1 of the capacitor body 110, respectively.

In this case, the first and second band portions 131b and 141b may further be extended to portions of fifth and sixth surfaces 5 and 6 of the capacitor body 110 and a portion of the second surface 2 to improve adhesion strength.

In addition, in the first and second external electrodes 130 and 140, first and second plating layers 132 and 142 may be formed to cover the first and second conductive layers 131 and 141, respectively, if necessary.

The first and second plating layers 132 and 142 may include first and second nickel (Ni) plating layers formed on the first and second conductive layers 131 and 141, respectively, and first and second tin (Sn) plating layers formed on the first and second nickel plating layers, respectively.

The first and second plating layers 132 and 142 are provided to increase mutual adhesion strength when the multilayer capacitor 100 is mounted on a printed circuit board or the like by solder.

In addition, the first and second plating layers 132 and 142 may include 1-1 and 2-1 connection portions 132a and 142a, and 1-2 and 2-2 band portions 132b and 142b.

The 1-1 connection portion 132a is a portion formed on the first connection portion 131a of the first conductive layer 131, and the 1-1 band portion 132b is a portion extending from the 1-1 connection portion 132a to a portion of the first surface 1 of the capacitor body 110.

In this case, the 1-1 band portion 132b may cover the first band portion 131b, and may further extend to portions of the fifth and sixth surfaces 5 and 6 of the capacitor body 110 and a portion of the second surface 2 to increase adhesion strength and the like.

The 2-1 connection portion 142a is a portion formed on the second connection portion 141a of the second conductive layer 141, and the 2-1 band portion 142b is a portion extending from the 2-1 connection portion 142a to a portion of the first surface 1 of the capacitor body 110.

In this case, a 2-1 band portion 142b covers the second band portion 141b, and may further extend to portions of the fifth and sixth surfaces 5 and 6 of the capacitor body 110 and a portion of the second surface of the capacitor body 110 to improve adhesion strength or the like.

According to this embodiment, since the internal electrodes are disposed with a floating electrode structure, such that a multilayer capacitor may implement a high voltage and may secure a certain level of reliability by a voltage division method.

In a multilayer capacitor having a floating electrode structure, the reliability of the multilayer capacitor varies depending on the distance between the floating electrode and the first or second internal electrode (for example, parameter a) and the margin (for example, parameter b) of the internal electrodes, the distance between the floating electrodes, or the like.

In this embodiment, by adjusting the margins of the internal electrodes or the distance between the internal electrodes at an appropriate ratio, reliability in such a high-voltage product may be further improved.

The following table illustrates a comparison of Mean Time To Failure (MTTF) of a multilayer capacitor changing depending on the size of the capacitor body, the spacing of the internal electrodes, the margin, or the like.

MTTF is the average time to failure obtained by measuring simple operation time or equipment use time under the conditions of 105° C. and 1.5 Vr.

TABLE 1

| | a (mm) | b (mm) | c (mm) | a/L (%) | b/L (%) | c/W (%) | MTTF |
|---|---|---|---|---|---|---|---|
| 1 | 0.15 | 0.25 | 0.25 | 6.8 | 11.3 | 17.2 | 18.13 |
| 2 | 0.20 | 0.25 | 0.25 | 9.0 | 11.3 | 17.2 | 17.52 |
| 3 | 0.25 | 0.25 | 0.25 | 11.3 | 11.3 | 17.2 | 19.39 |
| 4 | 0.30 | 0.25 | 0.25 | 13.5 | 11.3 | 17.2 | 21.34 |

In Table 1, when the length of the capacitor body in the X direction is defined as L, the width of the capacitor body in the Y direction is defined as W, the distance between the first floating electrode and the first internal electrode or the distance between the first floating electrode and the second internal electrode is defined as a, the distance between the second floating electrode and the third surface of the capacitor body or the distance between the third floating electrode and the fourth surface of the capacitor body is defined as b, and the distance between one of the first and second internal electrodes and the first floating electrode and the fifth or sixth surface of the capacitor body is defined as c, the change of MTTF according to the change of a/L is illustrated.

In this case, L of the multilayer capacitor used in the test is 2.22 mm, W is 1.45=, b is 0.25 mm and c is 0.25 mm.

In one example, the length L of the capacitor body in the X direction may refer to a maximum length, or alternatively, an average value, of lengths of a plurality of segments, parallel to the X direction, that connect between the outermost boundary lines of the capacitor body in an image of a cross-section of the capacitor body in the X-Z plane at a central portion of the capacitor in the Y direction, obtained by an optical microscope or an SEM.

In one example, the width W of the capacitor body in the Y direction may refer to a maximum length, or alternatively, an average value, of lengths of a plurality of segments, parallel to the Y direction, that connect between the outermost boundary lines of the capacitor body in an image of a cross section of the capacitor body in the Y-Z plane at a central portion of the capacitor in the X direction, obtained by an optical microscope or an SEM. Alternatively, a micrometer or a caliper may be used to measure the width W of the capacitor body in the Y direction.

In one example, measurement of the parameter a, the parameter b, and the parameter c, and the like, may be performed based on an optical microscope or an SEM image of a corresponding cross-section described above. In one example, the parameter a, the parameter b, or the parameter c, and the like, may refer to a maximum value, or alternatively, an average value, of multiple measurements of respective parameter measured at different locations. Other cross-section, other measurement methods, or other measurement tools appreciated by one of ordinary skill in the art, even if not described in the present disclosure, may also be used.

Figure 5:
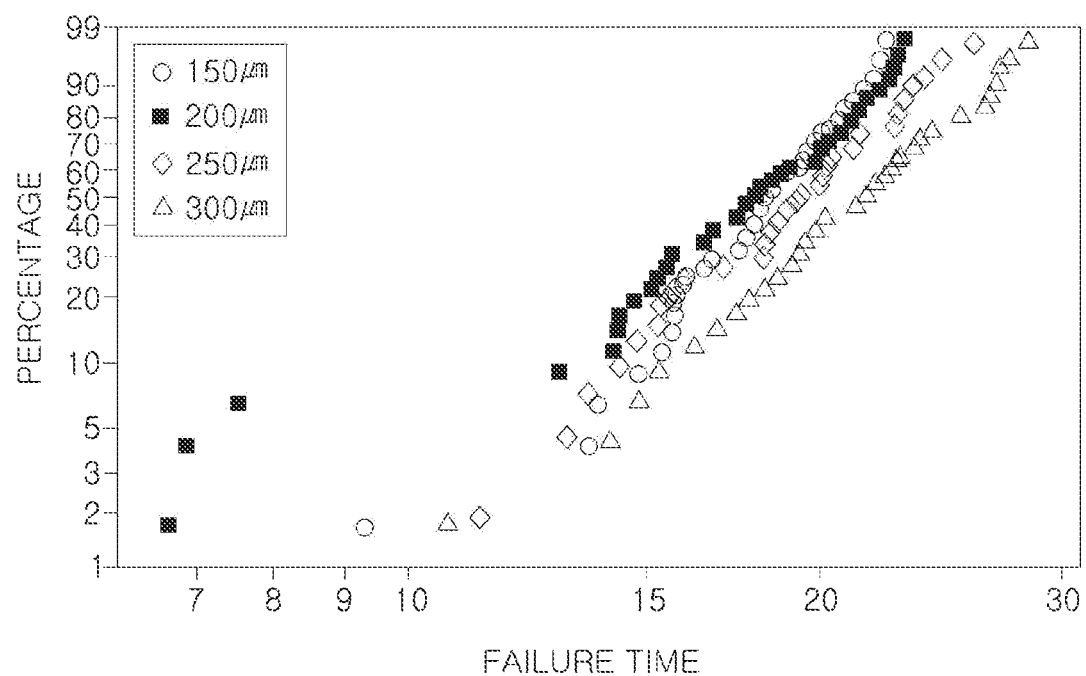
FIG. 5 is a graph illustrating an MTTF of a multilayer capacitor that changes according to a ratio (a/L) of a distance (a) between a first floating electrode and a first or second internal electrode to a length (L) of a capacitor body, in a multilayer capacitor having a structure of an internal electrode and a floating electrode according to an embodiment.
Figure 6:
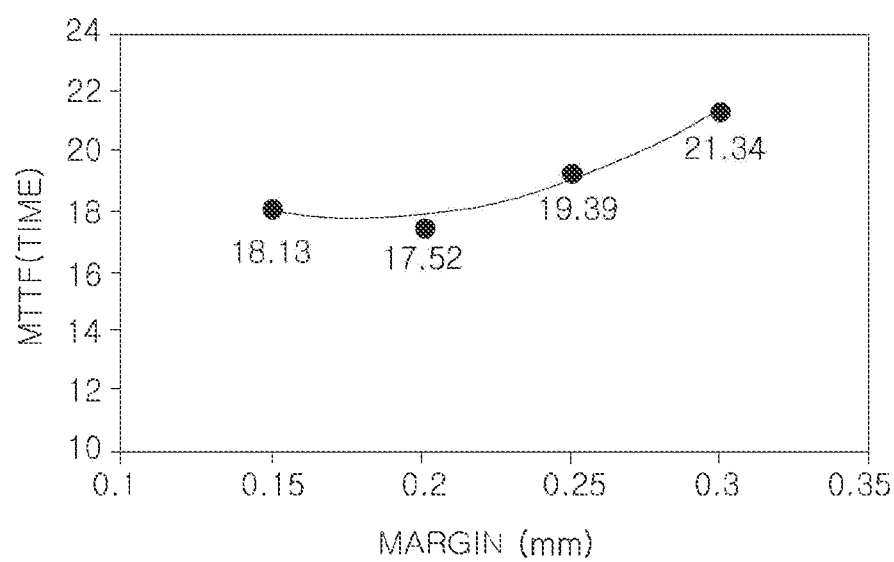
FIG. 6 is a graph illustrating an average MTTF of each sample in FIG. 5.

Referring to Table 1 and FIGS. 5 and 6 (in FIG. 5, different a is shown in different legend symbols), it can be seen that MTTF has a minimum value in #2 in which a/L is 9.0%, and the MTTF gradually increases from #3 in which a/L is 11.3%.

Therefore, when the length of the capacitor body in the X direction is defined as L, the distance between the first floating electrode and the first internal electrode or the distance between the first floating electrode and the second internal electrode is defined as a, a/L may be 0.113 or more.

TABLE 2

| a (mm) | b (mm) | c (mm) | a/L (%) | b/L (%) | c/W (%) | MTTF |
|---|---|---|---|---|---|---|
| 5 | 0.25 | 0.1 | 0.25 | 11.3 | 4.5 | 17.2 | 16.74 |
| 6 | 0.25 | 0.15 | 0.25 | 11.3 | 6.8 | 17.2 | 16.63 |
| 7 | 0.25 | 0.2 | 0.25 | 11.3 | 9.0 | 17.2 | 17.2 |
| 8 | 0.25 | 0.25 | 0.25 | 11.3 | 11.3 | 17.2 | 19.4 |
| 9 | 0.25 | 0.3 | 0.25 | 11.3 | 13.5 | 17.2 | 20.34 |

Table 2 illustrates the change in MTTF according to the change of b/L when the distance between the second floating electrode and the third surface of the capacitor body or the distance between the third floating electrode and the fourth surface of the capacitor body is defined as b.

In this case, the size of the multilayer capacitor used in the test is the same as in the previous test, and L is 2.22 mm and W is 1.45 mm. In addition, a is 0.25 mm and c is 0.25 mm by applying #3 of Table 1, the critical point in the previous test.

Figure 7:
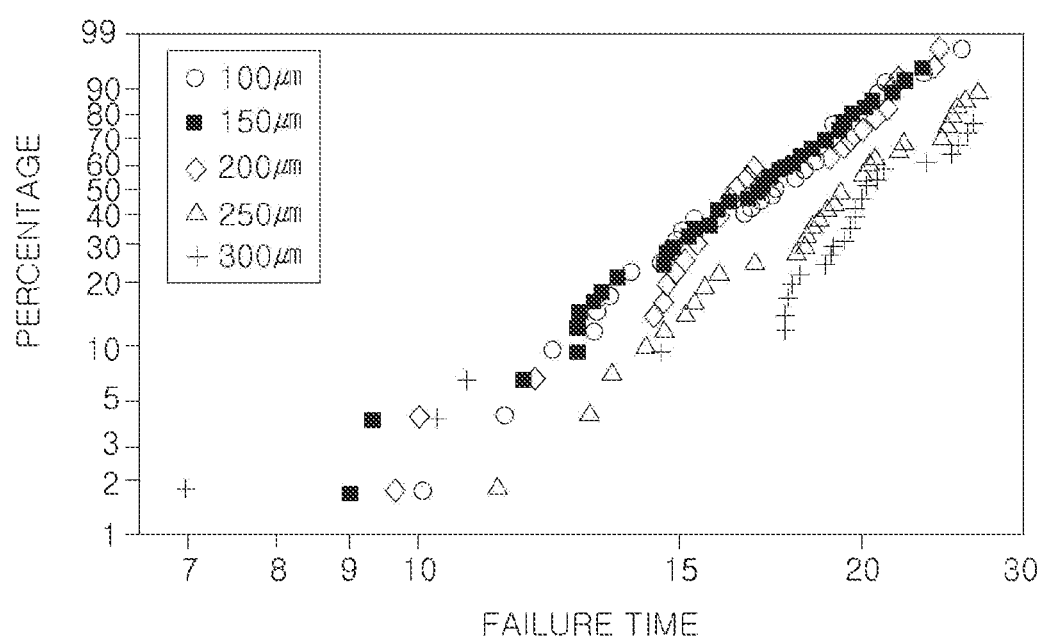
FIG. 7 is a graph illustrating the MTTF of a multilayer capacitor that changes according to a ratio (b/L) of a distance (b) between a first or second floating electrode and one surface of a capacitor body in the length direction with respect to a length (L) of the capacitor body, in a multilayer capacitor having a structure of an internal electrode and a floating electrode according to an embodiment.
Figure 8:
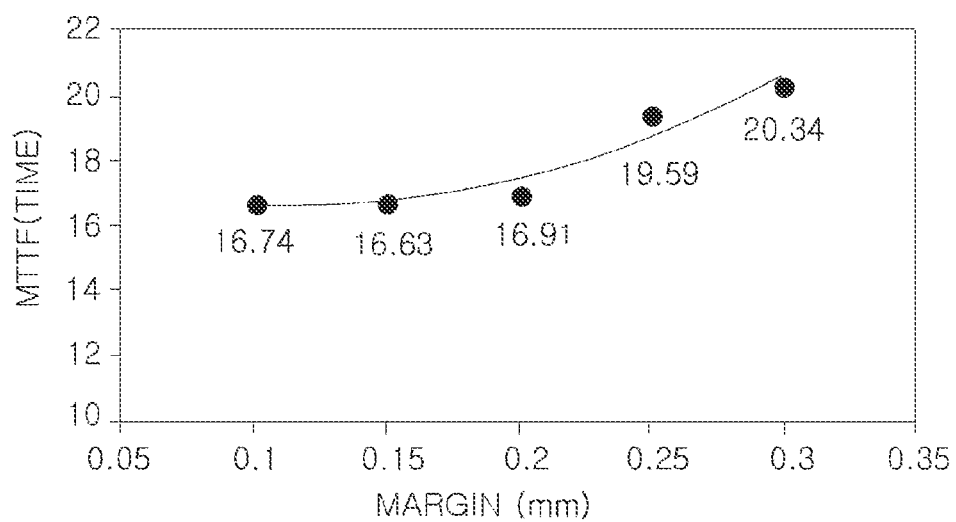
FIG. 8 is a graph illustrating the average MTTF of each sample in FIG. 7.

Referring to Table 2 and FIGS. 7 and 8 (in FIG. 7, different b is shown in different legend symbols), it can be seen that the MTTF gradually increases from #7 in which a b/L is 9.0%.

Accordingly, when the distance between the second floating electrode and the third surface of the capacitor body or the distance between the third floating electrode and the fourth surface of the capacitor body is defined as b, b/L may be 0.09 or more.

TABLE 3

| a (mm) | b (mm) | c (mm) | a/L (%) | b/L (%) | c/W (%) | MTTF |
|---|---|---|---|---|---|---|
| 10 | 0.25 | 0.25 | 0.1 | 11.3 | 11.3 | 6.9 | 16.2 |
| 11 | 0.25 | 0.25 | 0.15 | 11.3 | 11.3 | 10.3 | 16.53 |
| 12 | 0.25 | 0.25 | 0.2 | 11.3 | 11.3 | 113.8 | 18.33 |
| 13 | 0.25 | 0.25 | 0.25 | 11.3 | 11.3 | 17.2 | 19.39 |
| 14 | 0.25 | 0.25 | 0.3 | 11.3 | 11.3 | 20.7 | 22.29 |

Table 3 illustrates the change of MTTF according to the change of c/W, when the length of the capacitor body in the Y direction is defined as W, and the distance between one of the first and second internal electrodes and the first floating electrode and the fifth or sixth surface of the capacitor body is defined as c.

In this case, the size of the multilayer capacitor used in the test is the same as in the previous test, and L is 2.22 mm while W is 1.45 mm. In addition, a is 0.25 mm and b is 0.25 mm.

Figure 9:
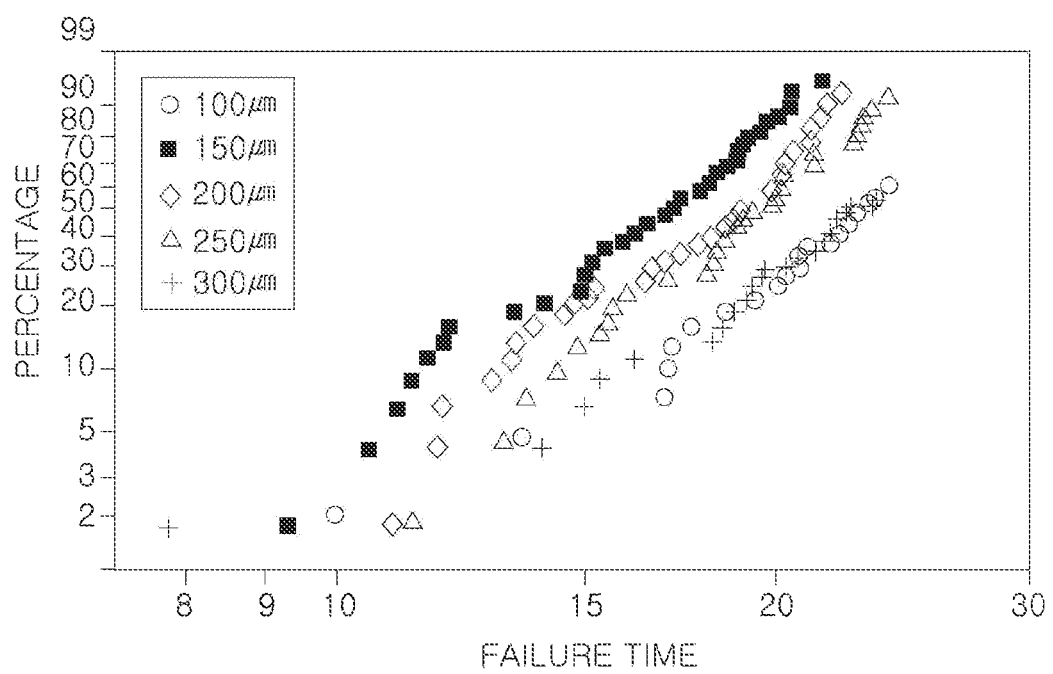
FIG. 9 is a graph illustrating the MTTF of a multilayer capacitor that changes according to a ratio (c/W) of a distance (c) between a first or second floating electrode and one surface of a capacitor body in the width direction, with respect to a width (W) of the capacitor body, in a multilayer capacitor having a structure of an internal electrode and a floating electrode according to an embodiment.
Figure 10:
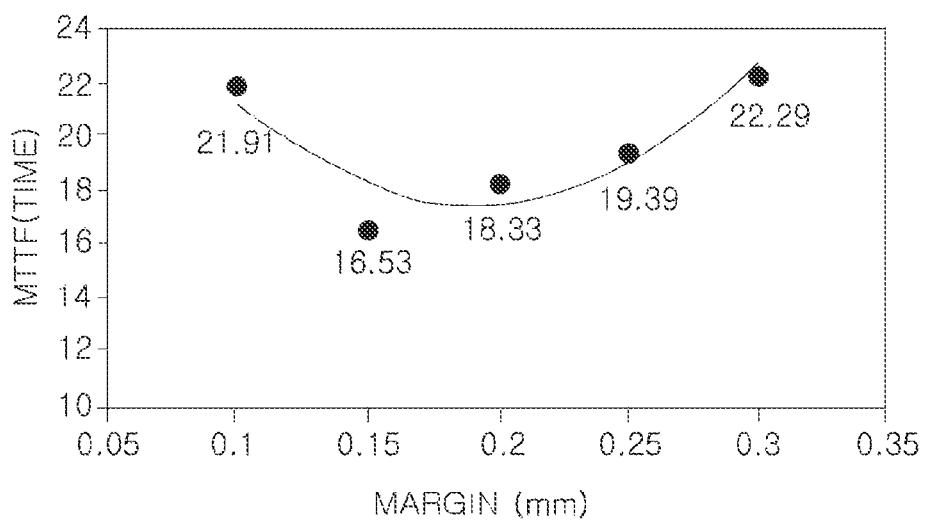
FIG. 10 is a graph illustrating the average MTTF of each sample in FIG. 9.

Referring to Table 3 and FIGS. 9 and 10 (in FIG. 9, different c is shown in different legend symbols), it can be seen that the MTTF significantly increases from #12 in which c/W is 13.8%.

Therefore, in the Y direction, when defining the length of the capacitor body as W, and defining the distance between one of the first and second internal electrodes and the first floating electrode and the fifth or sixth surface of the capacitor body as c, c/W may be 0.138 or more.

Figure 11:
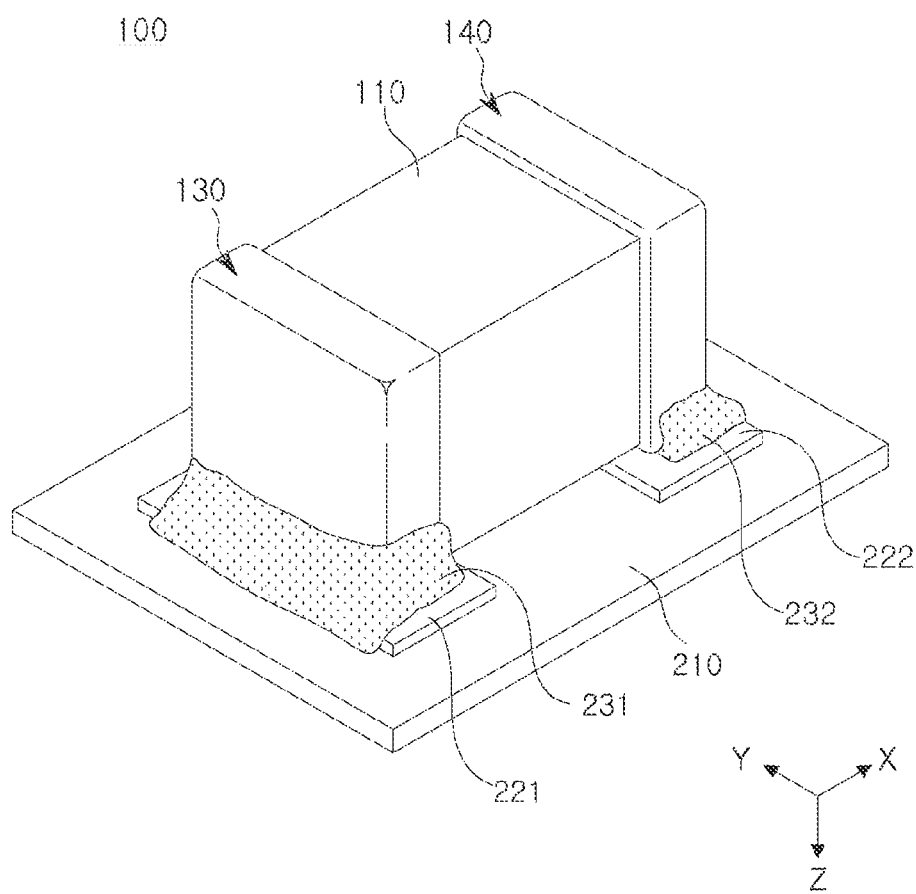
FIG. 11 is a perspective view schematically illustrating a coupling structure of a multilayer capacitor and a substrate according to an embodiment.

FIG. 11 is a perspective view schematically illustrating a combination structure of a multilayer capacitor and a substrate according to an embodiment.

Referring to FIG. 11, a board having the multilayer capacitor according to this embodiment, mounted thereon, includes a substrate 210 on which a multilayer capacitor 100 is mounted and first and second electrode pads 221 and 222 formed to be spaced apart from each other on an upper surface of the substrate 210.

The multilayer capacitor 100 may be electrically connected to the substrate 210 by solders 231 and 232, in a state in which the first and second external electrodes 130 and 140 are contacted with and are located on the first and second electrode pads 221 and 222, respectively.

In this case, the multilayer capacitor 100 may be a multilayer ceramic capacitor according to an exemplary embodiment, and a detailed description thereof will be omitted below to avoid redundancy.

As set forth above, according to an exemplary embodiment, there is an effect of preventing a decrease in reliability caused by application of a floating electrode in a multilayer capacitor.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multilayer capacitor comprising:
a capacitor body having first and second surfaces opposing each other, third and fourth surfaces connected to the first and second surfaces and opposing each other in a first direction, and fifth and sixth surfaces connected to the first and second surfaces, connected to the third and fourth surfaces, and opposing each other in a second direction, the capacitor body including a plurality of first and second dielectric layers and a plurality of internal electrodes stacked; and
first and second external electrodes disposed on the third and fourth surfaces of the capacitor body, respectively, wherein the plurality of internal electrode include:
first and second internal electrodes disposed on the first dielectric layer to be spaced apart from each other in the first direction, and connected to the first and second external electrodes, respectively;
a first floating electrode disposed between the first and second internal electrodes on the first dielectric layer; and
second and third floating electrodes disposed on the second dielectric layer to be spaced apart from each other in the first direction,
the second floating electrode overlaps a portion of the first internal electrode and a portion of the first floating electrode,
the third floating electrode overlaps a portion of the second internal electrode and a portion of the first floating electrode, and
a/L is greater than or equal to 0.113, in which L is a length of the capacitor body in the first direction, and a is a distance between the first floating electrode and the first internal electrode or a distance between the first floating electrode and the second internal electrode.

2. The multilayer capacitor of claim 1, wherein b/L is greater than or equal to 0.09, in which b is a distance between the second floating electrode and the third surface of the capacitor body or a distance between the third floating electrode and the fourth surface of the capacitor body.

3. The multilayer capacitor of claim 1, wherein c/W is greater than or equal to 0.138, in which W is a length of the capacitor body in the second direction, and c is a distance, in the second direction, between one of the first and second internal electrodes and the first floating electrode and the fifth or sixth surface of the capacitor body.

4. The multilayer capacitor of claim 1, wherein b/L is greater than or equal to 0.09, in which b is a distance between the second floating electrode and the third surface of the capacitor body or a distance between the third floating electrode and the fourth surface of the capacitor body, and
c/W is greater than or equal to 0.138, in which W is a length of the capacitor body in the second direction, and c is a distance, in the second direction, between one of the first and second internal electrodes and the first floating electrode and the fifth or sixth surface of the capacitor body.

5. The multilayer capacitor of claim 1, wherein a length of the first and second internal electrodes and the first floating electrode in the second direction is greater than a length of the second and third floating electrodes in the second direction.

6. The multilayer capacitor of claim 1, wherein the first and second external electrodes include, respectively:
first and second connection portions disposed on the third and fourth surfaces of the capacitor body respectively, and connected to the first and second internal electrodes respectively; and
first and second band portions extending from the first and second connection portions to a portion of the first surface of the capacitor body, respectively.

7. The multilayer capacitor of claim 1, wherein the first to third floating electrodes are spaced apart from the third to sixth surfaces,
the first external electrode is connected to the first internal electrode, and
the second external electrode is connected to the second internal electrode.

8. The multilayer capacitor of claim 1, wherein the first direction is perpendicular to the third and fourth surfaces of the capacitor body, and the second direction is perpendicular to the fifth and sixth surfaces of the capacitor body.

9. The multilayer capacitor of claim 1, wherein in a stacking direction of the plurality of first and second dielectric layers, the second floating electrode partially overlaps the first internal electrode and the first floating electrode and the third floating electrode partially overlaps the second internal electrode and the first floating electrode.

10. A board having a multilayer capacitor mounted thereon, the board comprising:
a substrate having first and second electrode pads on a surface; and
a multilayer capacitor,
wherein the multilayer capacitor includes,
a capacitor body having first and second surfaces opposing each other, third and fourth surfaces connected to the first and second surfaces and opposing each other in a first direction, and fifth and sixth surfaces connected to the first and second surfaces, connected to the third and fourth surfaces and opposing each other in a second direction, the capacitor body including a plurality of first and second dielectric layers and a plurality of internal electrodes stacked; and
first and second external electrodes disposed on the third and fourth surfaces of the capacitor body, respectively,
the plurality of internal electrodes include:
first and second internal electrodes disposed on the first dielectric layer to be spaced apart from each other in the first direction, and connected to the first and second external electrodes, respectively;
a first floating electrode disposed between the first and second internal electrodes, on the first dielectric layer; and
second and third floating electrodes disposed on the second dielectric layer, to be spaced apart from each other in the first direction,
the second floating electrode overlaps a portion of the first internal electrode and a portion of the first floating electrode,
the third floating electrode overlaps a portion of the second internal electrode and a portion of the first floating electrode,
a/L is greater than or equal to 0.113, in which L is a length of the capacitor body in the first direction, and a is a distance between the first floating electrode and the first internal electrode or a distance between the first floating electrode and the second internal electrode, and the multilayer capacitor is mounted in such a manner that the first and second external electrodes of the multilayer capacitor are connected to the first and second electrode pads, respectively.

11. The board of claim 10, wherein the multilayer capacitor has a b/L of 0.09 or more, in which b is a distance between the second floating electrode and the third surface of the capacitor body or a distance between the third floating electrode and the fourth surface of the capacitor body.

12. The board of claim 10, wherein c/W is 0.138 or more, in which W is a length of the capacitor body in the second direction, and c is a distance, in the second direction, between one of the first and second internal electrodes and the first floating electrode and the fifth or sixth surface of the capacitor body.

13. The board of claim 10, wherein
b/L is greater than or equal to 0.09, in which b is a distance between the second floating electrode and the third surface of the capacitor body or a distance between the third floating electrode and the fourth surface of the capacitor body, and
c/W is greater than or equal to 0.138, in which W is a length of the capacitor body in the second direction, and c is a distance, in the second direction, between one of the first and second internal electrodes and the first floating electrode and the fifth or sixth surface of the capacitor body.

14. A multilayer capacitor comprising:
a capacitor body having first and second surfaces opposing each other, third and fourth surfaces connected to the first and second surfaces and opposing each other in a first direction, and fifth and sixth surfaces connected to the first and second surfaces, connected to the third and fourth surfaces, and opposing each other in a second direction, the capacitor body including a plurality of first and second dielectric layers and a plurality of internal electrodes stacked; and
first and second external electrodes disposed on the third and fourth surfaces of the capacitor body, respectively,
wherein the plurality of internal electrode include:
first and second internal electrodes disposed on the first dielectric layer to be spaced apart from each other in the first direction, and connected to the first and second external electrodes, respectively;
a first floating electrode disposed between the first and second internal electrodes on the first dielectric layer; and
second and third floating electrodes disposed on the second dielectric layer to be spaced apart from each other in the first direction,
the second floating electrode overlaps a portion of the first internal electrode and a portion of the first floating electrode,
the third floating electrode overlaps a portion of the second internal electrode and a portion of the first floating electrode, and
b/L is greater than or equal to 0.09, in which L is a length of the capacitor body in the first direction, and b is a distance between the second floating electrode and the third surface of the capacitor body or a distance between the third floating electrode and the fourth surface of the capacitor body.

15. The multilayer capacitor of claim 14, wherein c/W is greater than or equal to 0.138, in which W is a length of the capacitor body in the second direction, and c is a distance, in the second direction, between one of the first and second internal electrodes and the first floating electrode and the fifth or sixth surface of the capacitor body.

16. The multilayer capacitor of claim 14, wherein a length of the first and second internal electrodes and the first floating electrode in the second direction is greater than a length of the second and third floating electrodes in the second direction.

17. The multilayer capacitor of claim 14, wherein the first and second external electrodes include, respectively:
first and second connection portions disposed on the third and fourth surfaces of the capacitor body respectively, and connected to the first and second internal electrodes respectively; and
first and second band portions extending from the first and second connection portions to a portion of the first surface of the capacitor body, respectively.

18. The multilayer capacitor of claim 14, wherein the first to third floating electrodes are spaced apart from the third to sixth surfaces,
the first external electrode is connected to the first internal electrode, and
the second external electrode is connected to the second internal electrode.

19. The multilayer capacitor of claim 14, wherein in a stacking direction of the plurality of first and second dielectric layers, the second floating electrode partially overlaps the first internal electrode and the first floating electrode and the third floating electrode partially overlaps the second internal electrode and the first floating electrode.

20. A multilayer capacitor comprising:
a capacitor body having first and second surfaces opposing each other, third and fourth surfaces connected to the first and second surfaces and opposing each other in a first direction, and fifth and sixth surfaces connected to the first and second surfaces, connected to the third and fourth surfaces, and opposing each other in a second direction, the capacitor body including a plurality of first and second dielectric layers and a plurality of internal electrodes stacked; and
first and second external electrodes disposed on the third and fourth surfaces of the capacitor body, respectively,
wherein the plurality of internal electrode include:
first and second internal electrodes disposed on the first dielectric layer to be spaced apart from each other in the first direction, and connected to the first and second external electrodes, respectively;
a first floating electrode disposed between the first and second internal electrodes on the first dielectric layer; and
second and third floating electrodes disposed on the second dielectric layer to be spaced apart from each other in the first direction,
the second floating electrode overlaps a portion of the first internal electrode and a portion of the first floating electrode,
the third floating electrode overlaps a portion of the second internal electrode and a portion of the first floating electrode, and
c/W is greater than or equal to 0.138, in which W is a length of the capacitor body in the second direction, and c is a distance, in the second direction, between one of the first and second internal electrodes and the first floating electrode and the fifth or sixth surface of the capacitor body.

21. The multilayer capacitor of claim 20, wherein a length of the first and second internal electrodes and the first floating electrode in the second direction is greater than a length of the second and third floating electrodes in the second direction.

22. The multilayer capacitor of claim 20, wherein the first and second external electrodes include, respectively:
   first and second connection portions disposed on the third and fourth surfaces of the capacitor body respectively, and connected to the first and second internal electrodes respectively; and
   first and second band portions extending from the first and second connection portions to a portion of the first surface of the capacitor body, respectively.

23. The multilayer capacitor of claim 20, wherein the first to third floating electrodes are spaced apart from the third to sixth surfaces,
   the first external electrode is connected to the first internal electrode, and
   the second external electrode is connected to the second internal electrode.

24. The multilayer capacitor of claim 20, wherein in a stacking direction of the plurality of first and second dielectric layers, the second floating electrode partially overlaps the first internal electrode and the first floating electrode and the third floating electrode partially overlaps the second internal electrode and the first floating electrode.

* * * * *